(12) United States Patent
Huang

(10) Patent No.: US 12,039,924 B2
(45) Date of Patent: Jul. 16, 2024

(54) ASSEMBLED LIGHT EMITTING DIODE DISPLAY DEVICE

(71) Applicant: MACROBLOCK, INC., Hsinchu (TW)

(72) Inventor: Ping-Kai Huang, Hsinchu (TW)

(73) Assignee: MACROBLOCK, INC., Hsinchu (TW)

( * ) Notice: Subject to any disclaimer, the term of this patent is extended or adjusted under 35 U.S.C. 154(b) by 0 days.

(21) Appl. No.: 18/446,498

(22) Filed: Aug. 9, 2023

(65) Prior Publication Data

US 2024/0071298 A1    Feb. 29, 2024

(30) Foreign Application Priority Data

Aug. 25, 2022 (TW) ................................. 111132112

(51) Int. Cl.
   *G09G 3/32*      (2016.01)
   *H01L 25/16*    (2023.01)

(52) U.S. Cl.
   CPC .............. *G09G 3/32* (2013.01); *H01L 25/162* (2013.01); *H01L 25/167* (2013.01)

(58) Field of Classification Search
   CPC ....... H01L 25/167; H01L 25/162; G09G 3/32; G09G 2300/0426
   See application file for complete search history.

(56) References Cited

U.S. PATENT DOCUMENTS

| | | | | |
|---|---|---|---|---|
| 10,504,882 | B2* | 12/2019 | Rogers | H01L 25/0753 |
| 10,566,258 | B2* | 2/2020 | Muto | H01L 23/49575 |
| 11,158,240 | B2* | 10/2021 | Rossini | H01L 25/0753 |
| 11,289,015 | B2* | 3/2022 | Iguchi | G09G 3/006 |
| 11,335,247 | B2 | 5/2022 | Bong | |
| 11,430,853 | B2* | 8/2022 | Lu | H10K 59/131 |
| 11,894,335 | B2* | 2/2024 | Yamada | H01L 24/08 |

(Continued)

FOREIGN PATENT DOCUMENTS

| CN | 113066427 A | 7/2021 |
|---|---|---|
| TW | 202215636 A | 4/2022 |

OTHER PUBLICATIONS

Search Report appended to an Office Action, which was issued to Taiwanese counterpart application No. 111132112 by the TIPO on May 4, 2023, with an English translation thereof.

*Primary Examiner* — Vinh T Lam
(74) *Attorney, Agent, or Firm* — Akerman LLP; Peter A. Chiabotti

(57) ABSTRACT

An assembled LED display device includes a system motherboard, and multiple to-be-assembled daughterboards assembled on the system motherboard. The system motherboard includes a drive power circuit including multiple power lines, and a gate control circuit including multiple gate lines. Each to-be-assembled daughterboard includes a substrate, at least one transistor switch, and a plurality of LED units disposed on the substrate and each including multiple LEDs connected to a same one of the at least one transistor switch. The LEDs of the LED units of the to-be-assembled daughterboards are arranged in a matrix having multiple rows and multiple columns. With respect to each column, the LEDs in the column are connected to the power line corresponding to the column. With respect to each to-be-assembled daughterboard, gate terminal(s) of the at least one transistor switch is(are) connected to the gate line corresponding to the to-be-assembled daughterboard.

11 Claims, 5 Drawing Sheets

(56) References Cited

U.S. PATENT DOCUMENTS

| | | | |
|---|---|---|---|
| 2008/0042549 A1* | 2/2008 | Song | G09G 3/3225 |
| | | | 445/24 |
| 2016/0343771 A1 | 11/2016 | Bower et al. | |
| 2018/0158808 A1* | 6/2018 | Zhang | H01L 25/167 |
| 2020/0119236 A1* | 4/2020 | Yang | H01L 27/1214 |
| 2022/0278260 A1* | 9/2022 | Chang | H01L 33/62 |
| 2022/0293816 A1* | 9/2022 | Ng | B41M 5/0047 |
| 2023/0107672 A1* | 4/2023 | Hua | H01L 25/0753 |
| | | | 257/79 |
| 2024/0122034 A1* | 4/2024 | Xu | G09G 3/3266 |

* cited by examiner

ASSEMBLED LIGHT EMITTING DIODE DISPLAY DEVICE

CROSS-REFERENCE TO RELATED APPLICATION

This application claims priority to Taiwanese Patent Application No. 111132112, filed on Aug. 25, 2022.

FIELD

The disclosure relates to a light emitting diode (LED) display device, and more particularly to an assembled LED display device.

BACKGROUND

In recent years, light emitting diodes (LEDs), especially miniature LEDs (such as mini-LEDs or micro-LEDs), have been widely used in different fields and have become the mainstream light source because of their advantages such as small size, high brightness, low heat generation, power efficiency, etc. However, when it is necessary to use a large number of LEDs, for example, when the LEDs are to be applied as a display light source of a display device and the LEDs are to be mass transferred during assembly, because of the miniaturization of the LEDs and the huge amount of LEDs required, mass transfer of the LEDs is not only a time consuming process, but may also encounter tolerance problems in the alignment of the LEDs. Therefore, the mass transfer of LEDs is a significant bottleneck holding back the commercial application of miniature LEDs.

SUMMARY

Therefore, an object of the disclosure is to provide an assembled light emitting diode (LED) display device that can alleviate at least one of the drawbacks of the prior art.

According to the disclosure, the assembled LED display device includes a system motherboard and a plurality of to-be-assembled daughterboards. The system motherboard includes a drive power circuit and a gate control circuit. The to-be-assembled daughterboards are assembled on the system motherboard. Each of the to-be-assembled daughterboards includes a substrate, at least one transistor switch, and a plurality of LED units which are disposed on the substrate and each of which includes a plurality of LEDs connected to a same one of the at least one transistor switch. The drive power circuit includes a plurality of power lines. The gate control circuit includes a plurality of gate lines that respectively correspond to the to-be-assembled daughterboards. The LEDs of the LED units of the to-be-assembled daughterboards are arranged in a matrix that has a plurality of rows and a plurality of columns respectively corresponding to said power lines. With respect to each of the columns, the LEDs in the column are connected to the power line that corresponds to the column. With respect to each of the to-be-assembled daughterboards, gate terminal(s) of the at least one transistor switch is(are) connected to the gate line that corresponds to the to-be-assembled daughterboard to receive a timing signal.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
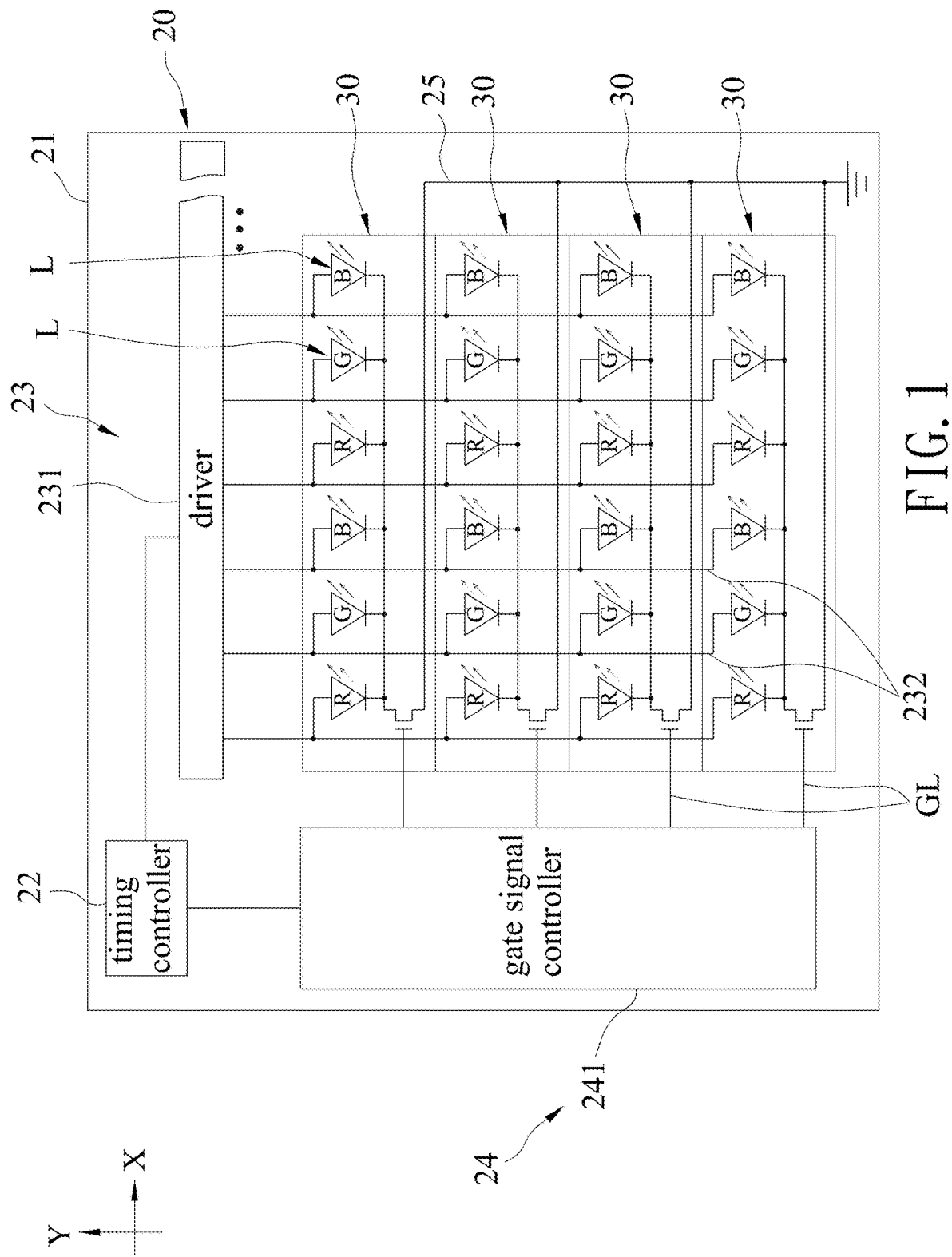
FIG. 1 is a schematic view illustrating an embodiment of an assembled light emitting diode display device according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
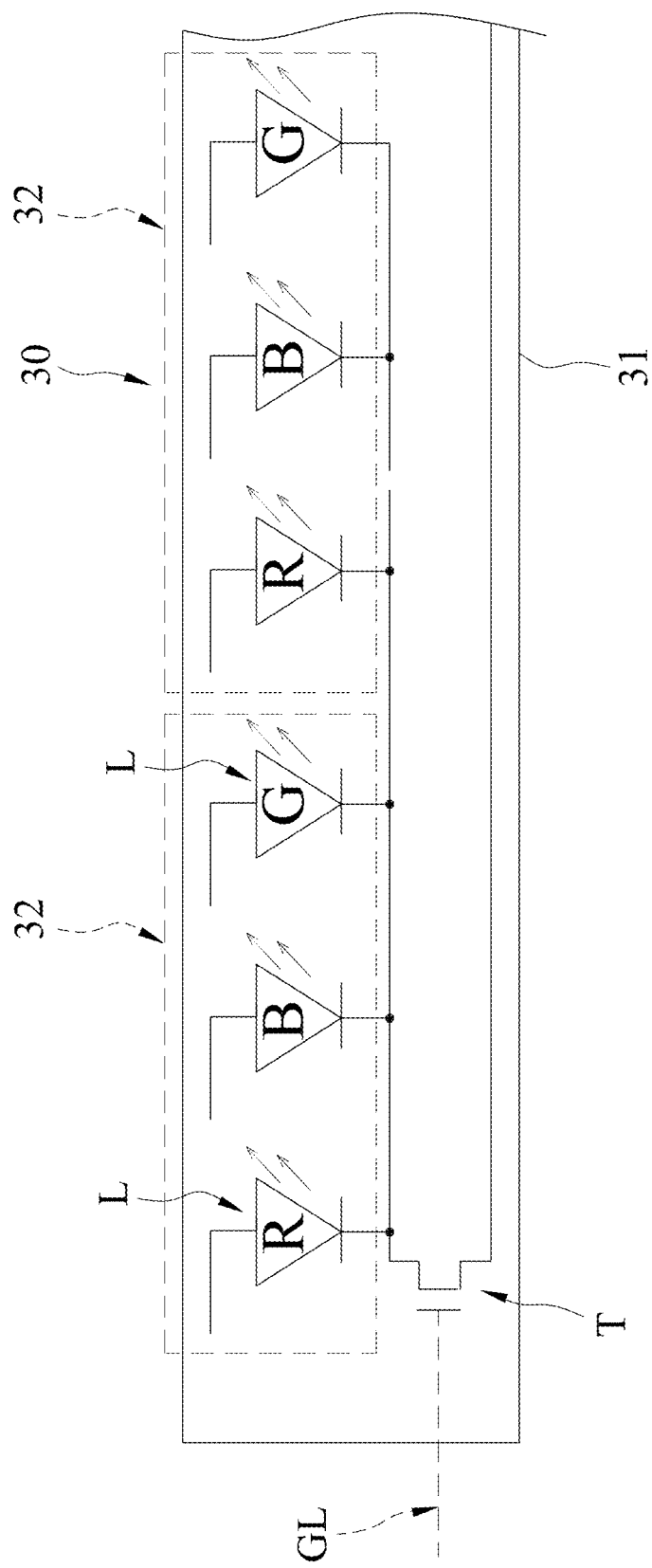
FIG. 2 is a schematic view illustrating a first implementation of each to-be-assembled daughterboard of the embodiment.

Referring to FIGS. 1 and 2, an embodiment of an assembled light emitting diode (LED) display device according to the disclosure includes a system motherboard 20 and a plurality of to-be-assembled daughterboards 30.

The system motherboard 20 includes a board body 21, a timing controller 22, a drive power circuit 23, a gate control circuit 24 and a ground circuit 25. The timing controller 22, the drive power circuit 23, the gate control circuit 24 and the ground circuit 25 are disposed on the board body 21. The drive power circuit 23 and the gate control circuit 24 are connected to the timing controller 22.

Specifically, the board body 21 is selected from, for example, a glass substrate, a silicon substrate, a polyimide (PI) substrate, a circuit board, etc. For illustration purposes, in this embodiment, the board body 21 is a circuit board that is formed with a circuit structure including multiple connection wires. The timing controller 22 is connected to the circuit structure, and is configured to provide timing signals that are required by the drive power circuit 23 and the gate control circuit 24. The drive power circuit 23 includes a driver 231 that is connected to the timing controller 22 through the circuit structure, and a plurality of power lines 232 that are connected to the driver 231. The power lines 232 extend along a first direction (Y), are arranged side by side along a second direction (X) traverse to the first direction (Y), and are spaced apart from each other. The driver 231 is configured to receive timing signals from the timing controller 22, and to provide and control a plurality of drive currents respectively to the power lines 232. The gate control circuit 24 includes a gate signal controller 241 that is connected to the timing controller 22 through the circuit structure, and a plurality of gate lines (GL) that are connected to the gate signal controller 241 and that extend along the second direction (X). It should be noted that, for illustration purposes, the first direction is the (Y) direction and the second direction is the (X) direction in this embodiment, but the disclosure is not limited to such configuration.

The to-be-assembled daughterboards 30 are assembled on the system motherboard 20. Each of the to-be-assembled daughterboards 30 includes a substrate 31, a plurality of LED units 32 and a transistor switch (T), where the substrate 31 has an area smaller than that of the board body 21 of the system motherboard 20, and the LED units 32 and the transistor switch (T) are disposed on the substrate 31.

With respect to each of the to-be-assembled daughterboards 30, the substrate 31 is selected from a glass substrate, a silicon substrate, a polyimide substrate, a circuit board, etc. Each of the LED units 32 includes three LEDs (L) of three different colors. FIGS. 1 and 2 depict an example where the LEDs (L) of each of the LED units 32 include a red LED (R), a green LED (G) and a blue LED (B). The transistor switch (T) is connected to the LEDs (L) of the LED units 32.

With respect to each of the to-be-assembled daughterboards 30, each of the LEDs (L) of the LED units 32 is an LED of a normal size (i.e., its length and width is no greater than 100 μm), or is a mini-LED or a micro-LED of a smaller size (i.e., its length and width is no greater than 20 μm). The transistor switch (T) is a field effect transistor (FET). For example, the transistor switch (T) is in the form of a thin film transistor (TFT), and is fabricated on the substrate 31 by a semiconductor fabrication process. A type of the transistor switch (T) is dependent on a material of the substrate 31. For example, when the substrate 31 is a glass substrate and a material deposited on a surface of the substrate 31 is amorphous silicon, the transistor switch (T) can only be an N-type TFT; when the substrate 31 is a glass substrate and the material deposited on the surface of the substrate 31 is low temperature polycrystalline silicon (LTPS), the transistor switch (T) can be any one of an N-type TFT and a P-type TFT; and when the substrate 31 is a silicon substrate, the transistor switch (T) can be any one of an N-type transistor and a P-type transistor.

It should be noted that, the LEDs (L) to be disposed on the same substrate 31 may be placed on the substrate 31 by transferring the LEDs (L) formed on an original epitaxial substrate to the substrate 31 one at a time or multiple at a time using a chip transfer method. Alternatively, the LEDs (L) to be disposed on the same substrate 31 may be placed on the substrate 31 by aligning and forming the LEDs (L) on at least one transparent substrate and then connecting the LEDs (L) to the substrate 31 using a flip-chip method, so the LEDs (L) are sandwiched between the at least one transparent substrate and the substrate 31, and light emitted by the LEDs (L) will penetrate the at least one transparent substrate to be emitted outside. The LEDs (L) will be transferred to the substrate 31 in batches when the LEDs (L) are formed on multiple transparent substrates, and will be transferred to the substrate 31 all at one time when the LEDs (L) are formed on a single transparent substrate. Therefore, the number of transfers can be reduced.

It should also be noted that, when multiple LEDs (L) are transferred to the same substrate 31 each time, the LEDs (L) of each of the LED units 32 can be connected to each other in a common cathode configuration or in a common anode configuration. In addition, the LEDs (L) of each of the LED units 32 may emit light of different wavelengths by using different light-emitting materials. For example, each of the LED units 32 includes three LEDs (L) that respectively emit red light, blue light and green light. Alternatively, the LEDs (L) of each of the LED units 32 may be made of the same short-wavelength light-emitting material (blue or ultraviolet light-emitting material) to emit light of the same color, and different light-converting materials such as fluorescent powders, quantum dots, etc. are used to perform wavelength conversion so as to attain lights of different colors (e.g., red, blue, green, etc.). Detailed structure of the common cathode configuration and the common anode configuration of the LEDs (L) and material selection of the LEDs (L) are well known to those skilled in the art, and are omitted herein for the sake of brevity.

The assembled LED display device of this embodiment may be assembled in the following way. At first, a plurality of LEDs (L) formed on at least one substrate other than the substrates 31 are transferred to the substrates 31, so as to have the LED units 32 placed on the substrates 31, and then the LEDs (L) are connected to the transistor switches (T), so as to obtain the to-be-assembled daughterboards 30. Thereafter, the to-be-assembled daughterboards 30 are assembled on the board body 21, and then the LEDs (L) are connected to the drive power circuit 23 and the transistor switches (T) are connected to the gate control circuit 24 and the ground circuit 25, so as to obtain the assembled LED display device of this embodiment.

FIGS. 1 and 2 depict an implementation where each of the transistor switches (T) of the to-be-assembled daughterboards 30 is an N-type transistor, and each of the LED units 32 of the to-be-assembled daughterboards includes three LEDs (L) of different colors (e.g., a red LED (R), a green LED (G) and a blue LED (B)). When the to-be-assembled daughterboards 30 are assembled on the board body 21, the LEDs (L) of the LED units 32 of the to-be-assembled daughterboards 30 are arranged in a matrix that has a plurality of rows and a plurality of columns respectively corresponding to the power lines 232. The LEDs (L) of each of the LED units 32 of the to-be-assembled daughterboards 30 are connected to each other in a common cathode configuration. With respect to each of the columns, anodes of the LEDs (L) in the column are connected to the power line 232 that corresponds to the column, so as to receive the drive current provided on the power line 232. The to-be-assembled daughterboards 30 respectively correspond to the gate lines (GL). With respect to each of the to-be-assembled daughterboards 30, the LEDs (L) of the LED units 32 are arranged in the same row, cathodes of the LEDs (L) of the LED units 32 are connected to a drain terminal of the transistor switch (T), a gate terminal of the transistor switch (T) is connected to the gate lines (GL) that corresponds to the to-be-assembled daughterboard 30, and a source terminal of the transistor switch (T) is connected to the ground circuit 25.

In this embodiment, the assembled LED display device performs time multiplexed scan and constant current drive. Specifically, the driver 231 is operable, based on timing signals received from the timing controller 22, to provide or not to provide drive currents with a constant magnitude respectively to the power lines 221. The gate signal controller 241 turns on the transistor switches (T) of the to-be-assembled daughterboards 30 sequentially without overlapping in time, so the LEDs (L) that are connected to the turned-on transistor switch (T) respectively receives the drive currents.

In this embodiment, with respect to each of the to-be-assembled daughterboards 30, since the LEDs (L) of the LED units 32 can be transferred to the substrate 31 multiple at a time, the number of transfers can be reduced, thereby improving placement efficiency. In addition, when each of the LEDs (L) of the LED units 32 of the to-be-assembled daughterboards 30 is a miniature LED, by virtue of assembling the to-be-assembled daughterboards 30, each disposed with a plurality of LED units 32, to the board body 21, tolerance problems such as alignment of the LEDs (L) of the LED units 32 of the to-be-assembled daughterboards 30 and deformation and warping of the board body 21 can be prevented.

Figure 3:
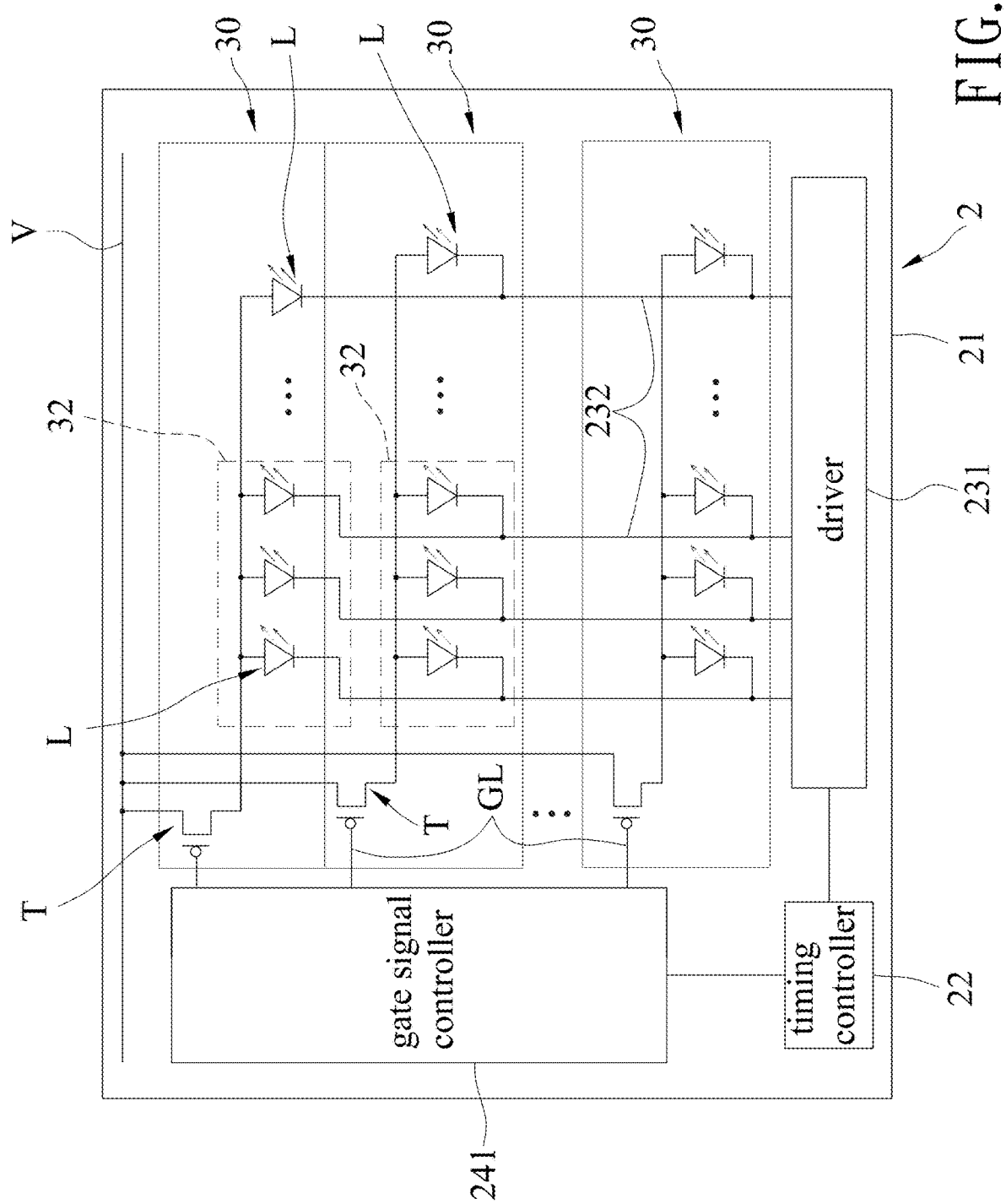
FIG. 3 is a schematic view illustrating a modification of the embodiment.

FIG. 3 depicts a modification of this embodiment that is similar to this embodiment but differs from this embodiment in what will be described below. In the modification depicted in FIG. 3, each of the transistor switches (T) of the to-be-assembled daughterboards 30 is a P-type TFT. The LEDs (L) of each of the LED units 32 of the to-be-assembled daughterboards 30 are connected to each other in a common anode configuration. With respect to each of the columns, the cathodes of the LEDs (L) in the column are connected to the power line 232 that corresponds to the column. With respect to each of the to-be-assembled daughterboards 30, the anodes of the LEDs (L) of the LED units 32 are connected to the drain terminal of the transistor switch (T), and the source terminal of the transistor switch (T) is connected to a positive power source (V).

In some implementations of this embodiment, each of the to-be-assembled daughterboards 30 may include a plurality of transistor switches (T), a total number of which is equal to a total number of the LED units 32 of the to-be-assembled daughterboard 30.

Figure 4:
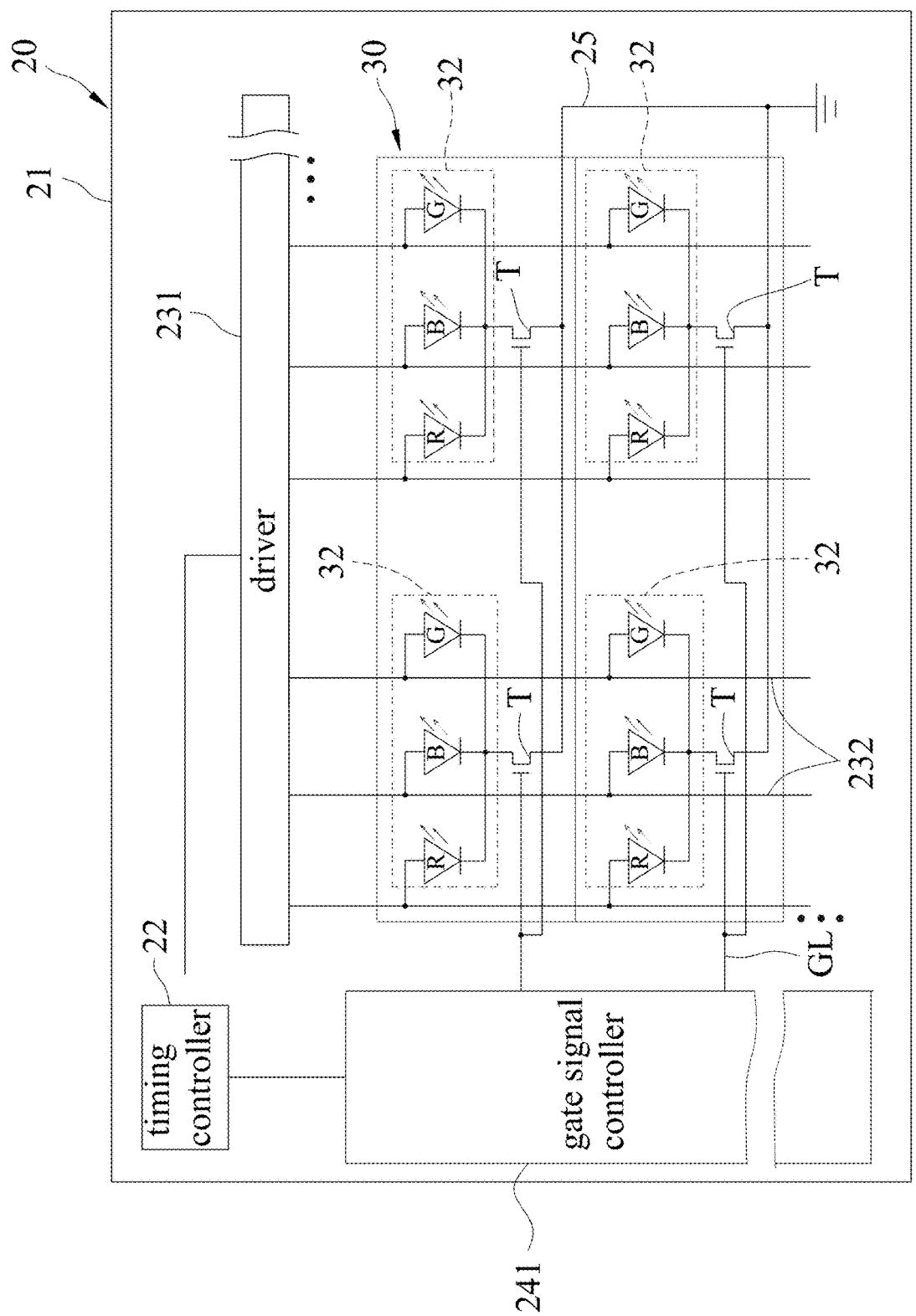
FIG. 4 is a schematic view illustrating a second implementation of each to-be-assembled daughterboard of the embodiment.

FIG. 4 depicts an implementation that is similar to the implementation depicted in FIGS. 1 and 2, but differs from the implementation depicted in FIGS. 1 and 2 in what will be described below. In the implementation depicted in FIG. 4, each of the to-be-assembled daughterboards 30 includes a plurality of LED units 32 and a plurality of transistor switches (T), where a total number of the transistor switches (T) is equal to a total number of the LED units 32. With respect to each of the to-be-assembled daughterboards 30, the drain terminal of each of the transistor switches (T) is connected to the cathodes of the three LEDs (L) of a respective one of the LED units 32, the gate terminals of the transistor switches (T) are connected to the gate line (L) that corresponds to the to-be-assembled daughterboard (30), and the source terminals of the transistor switches (T) are connected to the ground circuit 25. It should be noted that each of the LED units 32 is connected to one of the transistor switches (T) in the implementation depicted in FIG. 4, but in other implementations, two or more of the LED units 32 may be connected to a same one of the transistor switches (T), depending on demand and design. By virtue of each of the to-be-assembled daughterboards 30 including a plurality of transistor switches (T), parasitic capacitance/inductance effect can be reduced, thereby improving display quality.

Figure 5:
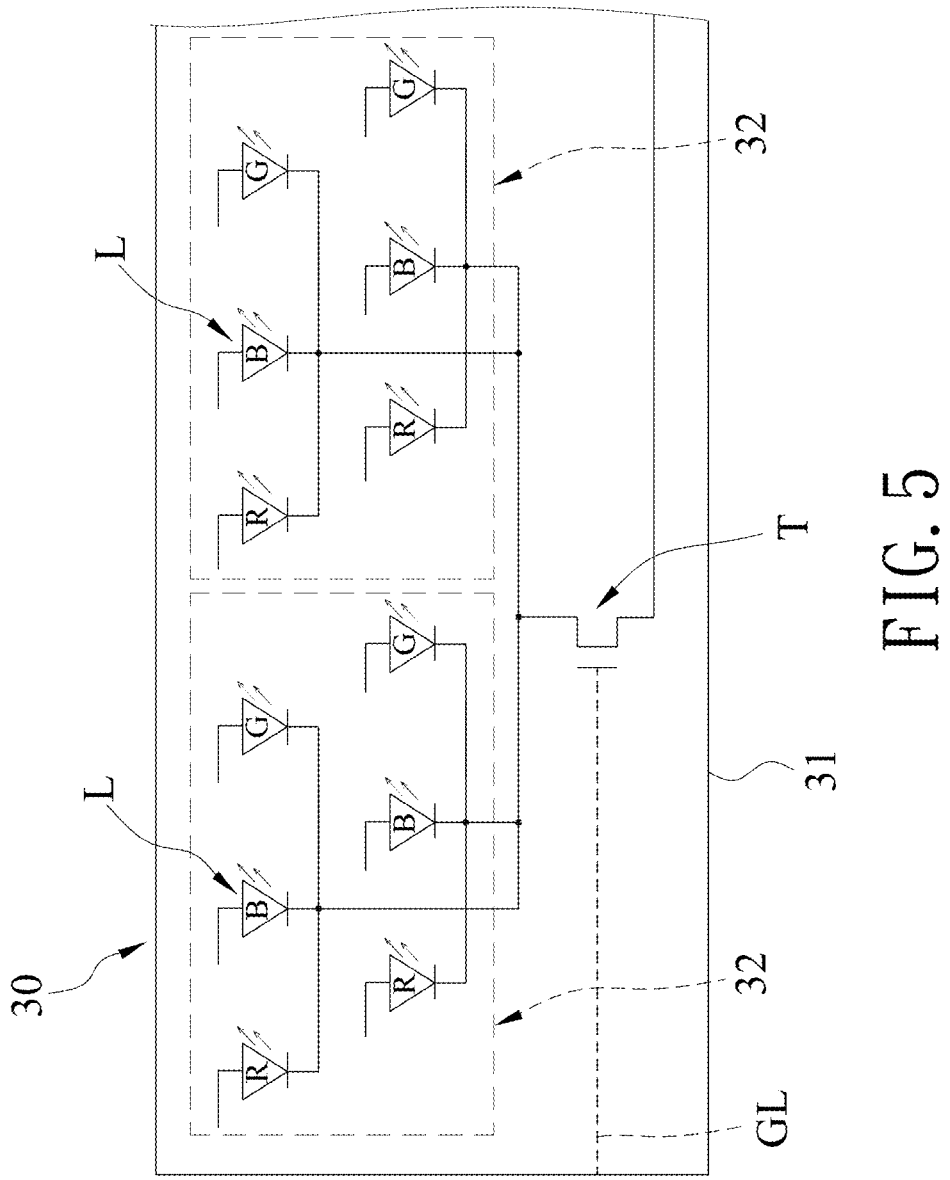
FIG. 5 is a schematic view illustrating a third implementation of each to-be-assembled daughterboard of the embodiment.

In some implementations of this embodiment, each of the LED units 32 of the to-be-assembled daughterboards 30 may include more than three LEDs (L). FIG. 5 depicts an implementation that is similar to the implementation depicted in FIGS. 1 and 2, but differs from the implementation depicted in FIGS. 1 and 2 in what will be described below. In the implementation depicted in FIG. 5, each of the LED units 32 of the to-be-assembled daughterboards 30 includes six LEDs (L) of different colors (e.g., two red LEDs (R), two blue LEDs (B) and two green LEDs (G)). With respect to each of the to-be-assembled daughterboards 30, the LEDs (L) of each of the LED units 32 are arranged in two rows, and are connected to the transistor switch (T). That is, all of the LEDs (L) of the LED units 32 are connected to the same transistor switch (T). However, the disclosure is not limited to such configuration. Moreover, in a modification of the implementation depicted in FIG. 5, each of the to-be-assembled daughterboards 30 may include a plurality of transistor switches (T), each of which is connected to one or more of the LED units 32 of the to-be-assembled daughterboard 30.

It should be noted that the LEDs (L) of the LED units 32 of the to-be-assembled daughterboards 30 may be arranged in a matrix as shown in FIG. 4, or may be arranged in other ways, as long as the arrangement of the LEDs (L) on the board body 21 can comply with display requirements and can facilitate connection of the LEDs (L) to the power lines 232.

Referring back to FIG. 1, in view of the above, in this embodiment, the LEDs (L) are first transferred to the substrates 31 so as to obtain the to-be-assembled daughterboards 30, and then to-be-assembled daughterboards 30 are assembled to the board body 21 of the system motherboard 20 so as to obtain the assembled LED display device. With respect to each of the to-be-assembled daughterboards 30, since the LEDs (L) of the LED units 32 can be transferred to the substrate 31 multiple at a time, the number of transfers can be reduced, thereby improving placement efficiency. In addition, when each of the LEDs (L) of the LED units 32 of the to-be-assembled daughterboards 30 is a miniature LED, by virtue of assembling the to-be-assembled daughterboards 30, each disposed with a plurality of LED units 32, to the board body 21 of the system motherboard 20, tolerance problems such as alignment of the LEDs (L) of the LED units 32 of the to-be-assembled daughterboards 30 and deformation and warping of the board body 21 can be prevented.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. An assembled light emitting diode (LED) display device comprising:
   a system motherboard including a drive power circuit and a gate control circuit; and
   a plurality of to-be-assembled daughterboards assembled on said system motherboard, each of said to-be-assembled daughterboards including a substrate, at least one transistor switch, and a plurality of LED units which are disposed on said substrate and each of which includes a plurality of LEDs connected to a same one of said at least one transistor switch;

wherein said drive power circuit includes a plurality of power lines, said gate control circuit includes a plurality of gate lines that respectively correspond to said to-be-assembled daughterboards, and said LEDs of said LED units of said to-be-assembled daughterboards are arranged in a matrix that has a plurality of rows and a plurality of columns respectively corresponding to said power lines;

wherein, with respect to each of said columns, said LEDs in said column are connected to said power line that corresponds to said column; and wherein, with respect to each of said to-be-assembled daughterboards, gate terminal(s) of said at least one transistor switch is(are) connected to said gate line that corresponds to said to-be-assembled daughterboard so as to receive a timing signal.

2. The assembled LED display device as claimed in claim 1, wherein, with respect to each of said to-be-assembled daughterboards:
said to-be-assembled daughterboard includes a plurality of said transistor switches that respectively correspond to said LED units;
said LEDs of each of said LED units are connected to said transistor switch that corresponds to said LED unit; and
said gate terminals of said transistor switches are connected to said gate line that corresponds to said to-be-assembled daughterboard.

3. The assembled LED display device as claimed in claim 1, wherein, with respect to each of said to-be-assembled daughterboards:
said to-be-assembled daughterboard includes one said transistor switch; and
said LEDs of said LED units are connected to said transistor switch.

4. The assembled LED display device as claimed in claim 1, wherein each of said LED units of said to-be-assembled daughterboards includes at least three of said LEDs of different colors.

5. The assembled LED display device as claimed in claim 1, wherein said LEDs of each of said LED units of said to-be-assembled daughterboards are connected to each other in a common cathode configuration.

6. The assembled LED display device as claimed in claim 5, wherein each of said LEDs of said LED units of said to-be-assembled daughterboards has an anode that is connected to said power line connected to said LED, and a cathode that is connected to said transistor switch connected to said LED.

7. The assembled LED display device as claimed in claim 1, wherein said LEDs of each of said LED units of said to-be-assembled daughterboards are connected to each other in a common anode configuration.

8. The assembled LED display device as claimed in claim 7, wherein each of said LEDs of said LED units of said to-be-assembled daughterboards has a cathode that is connected to said power line connected to said LED, and an anode that is connected to said transistor switch connected to said LED.

9. The assembled LED display device as claimed in claim 1, wherein said system motherboard further includes a ground circuit that is connected to said transistor switches of said to-be-assembled daughterboards, and a timing controller that is connected to said drive power circuit and said gate control circuit.

10. The assembled LED display device as claimed in claim 1, wherein said drive power circuit further includes a driver that is connected to said power lines and that is configured to provide and control a plurality of drive currents respectively to said power lines.

11. The assembled LED display device as claimed in claim 1, wherein:
said substrate of each of said to-be-assembled daughterboards is selected from a glass substrate, a silicon substrate, a polyimide substrate and a circuit board;
said system motherboard further includes a board body;
said drive power circuit and said gate control circuit are disposed on said board body; and
said board body is selected from a glass substrate, a silicon substrate, a polyimide substrate and a circuit board.

* * * * *